(12) United States Patent
Maloizel et al.

(10) Patent No.: US 9,184,600 B2
(45) Date of Patent: Nov. 10, 2015

(54) METHOD FOR BALANCING THE VOLTAGES OF ELECTROCHEMICAL CELLS CONNECTED IN SEVERAL PARALLEL BRANCHES

(71) Applicant: SAFT, Bagnolet (FR)

(72) Inventors: Serge Maloizel, Trois Palis (FR); Antoine Perot, Bruges (FR)

(73) Assignee: SAFT, Bagnolet (FR)

( * ) Notice: Subject to any disclaimer, the term of this patent is extended or adjusted under 35 U.S.C. 154(b) by 342 days.

(21) Appl. No.: 13/687,660

(22) Filed: Nov. 28, 2012

(65) Prior Publication Data

US 2013/0134943 A1 May 30, 2013

(30) Foreign Application Priority Data

Nov. 29, 2011 (FR) ..................................... 11 60918

(51) Int. Cl.
| | |
|---|---|
| *H01M 10/44* | (2006.01) |
| *H01M 10/46* | (2006.01) |
| *H02J 7/00* | (2006.01) |
| *G01R 31/36* | (2006.01) |
| *G01R 19/10* | (2006.01) |
| *H01M 10/052* | (2010.01) |
| *H01M 10/42* | (2006.01) |

(52) U.S. Cl.
CPC .................. *H02J 7/00* (2013.01); *H02J 7/0014* (2013.01); *H02J 7/0016* (2013.01); *G01R 19/10* (2013.01); *G01R 31/362* (2013.01); *G01R 31/3658* (2013.01); *H01M 10/052* (2013.01); *H01M 10/4207* (2013.01)

(58) Field of Classification Search
CPC ..... H02J 7/0013; H02J 7/0014; H02J 7/0018; H02J 7/0019

USPC .................. 320/107, 110, 116, 118, 120, 122
See application file for complete search history.

(56) References Cited

U.S. PATENT DOCUMENTS

| | | | | |
|---|---|---|---|---|
| 6,150,795 | A | * | 11/2000 | Kutkut et al. .................. 320/118 |
| 6,624,612 | B1 | * | 9/2003 | Lundquist ...................... 320/118 |
| 2008/0284375 | A1 | * | 11/2008 | Nagaoka et al. ............... 320/116 |
| 2011/0074354 | A1 | | 3/2011 | Yano |
| 2011/0248675 | A1 | * | 10/2011 | Shiu et al. ...................... 320/118 |
| 2012/0194133 | A1 | * | 8/2012 | Posamentier et al. ......... 320/116 |

FOREIGN PATENT DOCUMENTS

EP 2 075 894 A2 7/2009

OTHER PUBLICATIONS

French Search Report of FR 11 60 918 dated Jul. 13, 2012.

* cited by examiner

*Primary Examiner* — Edward Tso
(74) *Attorney, Agent, or Firm* — Sughrue Mion, PLLC (57) ABSTRACT

A method for balancing a battery (C) comprising a plurality of branches (Ba, Bb, . . . , Bn) in parallel, each branch comprising at least two electrochemical cells in series (E1$a$, E2$a$, E3$a$, E1$b$, E2$b$, E3$b$), with an activatable electrical energy discharge or transfer device (Rb) being connected across the terminals of each electrochemical cell, comprises activating the electrical energy discharge or transfer devices connected across the terminals of the cells of the branch that includes the electrochemical cell having the lowest voltage, with the exception of the electrical energy discharge or transfer device associated with the electrochemical cell having the lowest voltage, and simultaneously deactivating the electrical energy discharge or transfer devices connected across the terminals of the cells of the branch or branches that do not include the electrochemical cell with the lowest voltage.

14 Claims, 4 Drawing Sheets

METHOD FOR BALANCING THE VOLTAGES OF ELECTROCHEMICAL CELLS CONNECTED IN SEVERAL PARALLEL BRANCHES

TECHNICAL FIELD

The invention relates to the field of methods for balancing the voltages of the electrochemical cells making up a battery. The invention also relates to electronic systems for the implementation of such methods of balancing and a computer program product and a computer-readable data carrier.

STATE OF THE ART

A battery generally comprises a plurality of electrochemical cells (also called hereinafter cells) each of which is an energy generation device in which chemical energy is converted into electrical energy. The chemical energy is formed by electrochemically active compounds deposited on at least one side of electrodes arranged in the cell. Electrical energy is generated by electrochemical reactions during cell discharge. The electrodes, arranged in a container, are electrically connected to output terminals which establish electrical continuity between the electrodes and an electrical load to which the cell is associated. The amount of electrical energy that an electrochemical cell can provide is measured by its capacity in ampere hours multiplied by its voltage expressed in volts.

A battery may be divided into modules, each module being composed of a plurality of cells interconnected in series and/or in parallel and combined in the same battery case. The battery is intended for supplying electric energy to an external application. A charging circuit is generally provided to which the battery can be connected to charge the cells. A management system comprises sensors and electronic control circuitry of a greater or lesser degree of sophistication depending on the applications the battery may be used for. One of the functions of the management system is to measure the voltage of the cells and to deduce the state of charge of the cells. It will be recalled that state of charge (SOC) is the ratio of charged capacity to the nominal capacity the electrochemical cell is capable of providing. It is expressed as a percentage and reflects the amount of energy remaining available to the user. If the state of charge of one cell is outside a predetermined range, this can reflect a malfunctioning of this particular cell. The electronic control circuit then interrupts the charge or discharge of that cell so as to avoid it being subject to heavy overcharging or heavy discharge likely to reduce performance, but above all to limit its life.

Measuring the voltage (open circuit or under low-current discharge) of a lithium-ion type cell can provide an indication of the state of charge of that cell. Indeed, a lithium-ion type cell exhibits a variation of voltage with respect to time which is substantially constant as a function of its state of charge for a given discharge current. It is therefore possible, for this type of cell, to establish a relationship of proportionality between state of charge and voltage. However, due to a spread of self-discharge characteristics of the cells which for example can result from variations in the manufacturing process of said cells (presence of impurities in the cells which may cause leakage currents, etc.), a plurality of cells of the same battery may have different voltages and, consequently, different states of charge. It will be recalled that self-discharge is a phenomenon by which an electrochemical cell loses its capacity, although not powering an electrical load. This loss of capacity is due to leakage current internally of the cell, which occurs between the electrodes of the cell.

Balancing is a technique of bringing the various voltages of the electrochemical cells to the same value. This may consist of an "active" method of balancing in which energy from the most highly charged cells is transferred to the least charged cells in a system using for example inductive winding means, transformers or capacitors. It may also be a "passive" method of balancing in which a cell which is the most highly charged is discharged until its voltage reaches the voltage of a lesser charged cell, without transfer of energy from a most highly charged cell to a lesser charged cell. Once balancing of the battery has been achieved, the cells all have the same state of charge.

Figure 1:
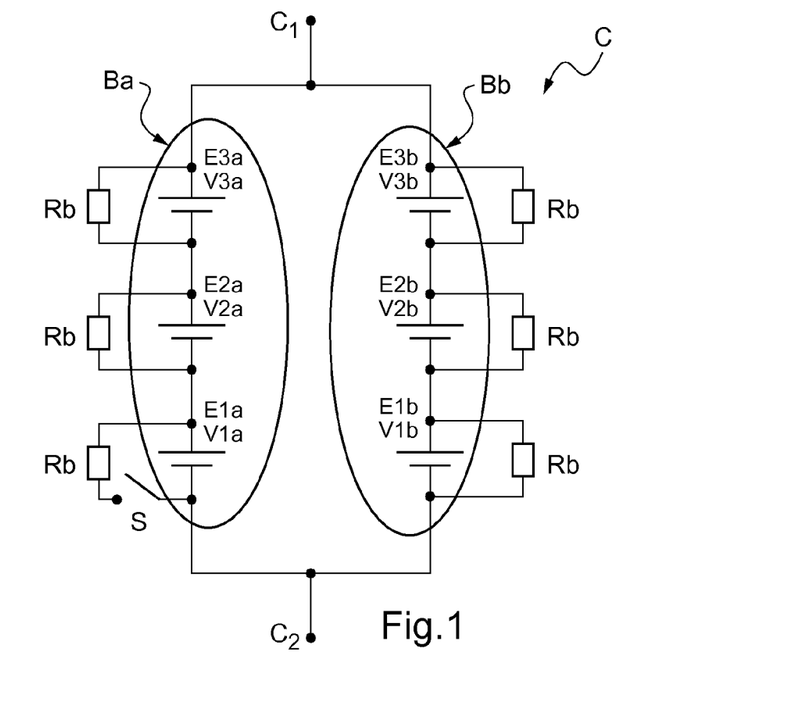

A battery may comprise several parallel branches of cells connected in series. Some cells connected in series can be grouped within a same battery casing forming a module. FIG. 1 shows a battery C made up of two branches Ba, Bb connected in parallel at connection points C1 and C2 to a charger or an application, not shown. Each branch comprises a plurality of electrochemical cells. Branch Ba comprises three cells E1a, E2a, E3a connected in series having respectively measured voltages V1a, V2a, V3a across their terminals. Branch Bb comprises three cells E1b, E2b, E3b connected in series having measured voltages V1b, V2b, V3b across their terminals. One method of balancing is to connect, during the balancing phase, a resistance Rb called a balancing resistor in parallel on all the cells except the one having the lowest voltage. A switch S in the open state prevents discharge of the cell E1a through resistor Rb. The principle of this balancing is to transform excess energy contained in electrochemical cells that are the most highly charged into heat so that they reach the same state of charge as the cell which is the least charged.

In the example of FIG. 1, the cells E2a, E3a, E1b, E2b and E3b have a higher voltage than that of the cell E1a. E1a is the electrochemical cell having the state of charge which is the lowest. A resistor Rb is connected across the cells E2a, E3a, E1b, E2b and E3b.

Figure 2:
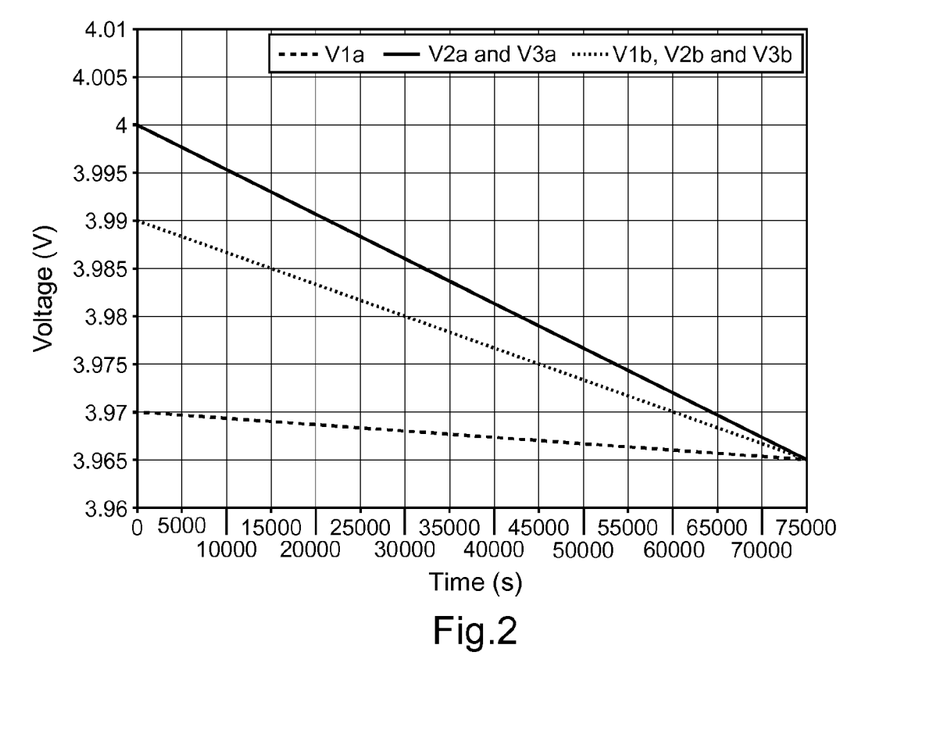
FIG. 2 shows variation with time of the electrochemical cell voltage in a balancing system implemented according to the prior art shown in FIG. 1. The electrochemical cells are of the lithium-ion type with a capacity of 45 Ah and the resistors are 43 ohms.

FIG. 2 shows variation of voltage during balancing. Before balancing, the voltages V1a, V2a, V3a are respectively 3.97, 4, and 4 V. Before balancing, the voltages V1b, V2b, V3b are identical and equal to 3.99 V. After balancing, the voltages are the same and equal to 3.965 V. It is noted that while the electrochemical cells of branch Bb drop by 25 mV, the electrochemical cells having a high voltage in branch Ba drop by 35 mV and the electrochemical cell having the lowest voltage of branch Ba drops by 5 mV. In general, the greater the number of cells included in the branch, the lesser the voltage drop of the electrochemical cell having the lowest voltage.

The disadvantage of this method is that during the balancing phase, the electrochemical cell which has the lowest voltage may undergo a slight discharge even though it has no balancing resistor connected in parallel. This slight discharge results from the fact that Kirchhoff's first law must be respected. Indeed, V1a+V2a+V3a must remain equal to V1b+V2b+V3b. Suppose V1a, V2a, V3a, V1b, V2b and V3b are equal to 4 V and that resistors are connected in parallel across V2a, V3a, V1b, V2b and V3b, it follows that V1a will also drop.

The problem of slight discharge experienced by the cell that is to be balanced cannot be solved by the simple implementation of a switch in series with the least charged cell. Indeed, it requires, firstly, use of a power switch capable of passing currents occurring in use for the branch which includes this cell and secondly, does not allow balancing during periods of use (charge or discharge) of the battery but only during the periods it is not being used.

There is therefore a need for a method of balancing in which the electrochemical cell to be balanced no longer undergoes discharge during balancing, with a view to further improving energy efficiency.

SUMMARY OF THE INVENTION

The invention is based on the finding that when balancing a battery comprising a plurality of parallel branches, it is particularly advantageous to not discharge all cells having a voltage higher than the voltage of the least charged cell whatever their position in the branches and to only discharge cells that are the most highly charged in the branch which includes a cell having the lowest state of charge. The balancing system in the branch may be of the discharge type in which the most charged cells are discharged into a discharge device or of the energy transfer type in which energy from the most charged cells is transferred into the least charged cells through an energy transfer device.

The invention provides a method for balancing a battery (C) comprising a plurality of branches (Ba, Bb, ..., Bn in a number not limited to a particular value) in parallel, each branch comprising at least two electrochemical cells in series (E1a, E2a, E3a, E1b, E2b, E3b), an activatable electrical energy discharge or transfer device (Rb) connected across the terminals of each electrochemical cell, said method comprising the following successive steps:

a) measuring a voltage across each electrochemical cell (V1a, V2a, V3a, V1b, V2b, V3b, ..., V1n) in a configuration where all the electrical energy discharge or transfer devices are not activated;

b) determining a lowest voltage and a highest voltage out of all the voltages measured in step a);

c) calculating a difference $\Delta V$ between the lowest voltage and the highest voltage from step b);

d) if $\Delta V$ exceeds a predetermined threshold value $\Delta Vs1$:

activating the electrical energy discharge or transfer device(s) connected across the terminals of the cell(s) of that branch which includes the electrochemical cell having the lowest voltage with the exception of the electrical energy discharge or transfer device associated with the electrochemical cell having the lowest voltage, simultaneously with:

deactivating the electrical energy discharge or transfer devices connected across the terminals of the cells of the branch or branches that do not include the electrochemical cell with the lowest voltage;

e) measuring a voltage across each electrochemical cell;

f) determining a lowest voltage and a highest voltage out of all the voltages measured in step e);

g) calculating a difference $\Delta V$ between the lowest voltage and the highest voltage;

h) if $\Delta V$ is less than a predetermined threshold value $\Delta Vs2$, strictly below $\Delta Vs1$, deactivating all discharge devices.

In the context of the present invention, the term "discharge device" means any device to reduce the state of charge of an electrochemical cell, in particular a resistor. The term "electrical energy transfer device" means any device making it possible to receive electrical energy from a first electrochemical cell and to transmit it to a second electrochemical cell. It may comprise first inductive winding means connected across the terminals of a first cell and second inductive winding means connected across the terminals of a second cell. Discharge of the first cell causes the flow of current through the first inductive winding means, creating a magnetic field. A current induced by the magnetic field is created in the second inductive winding means coupled to the first inductive winding means. If the second inductive winding means are connected across the terminals of a second electrochemical cell, the current induced in the second inductive winding means can recharge the second electrochemical cell. The electrical energy transfer device can also be a capacitor that receives in a first step electrical energy from a first cell and then transfers it to a second electrochemical cell.

The term "activation of the electrical energy discharge or transfer device" means that a current is caused to flow into the discharge or transfer of electrical energy device. In the case where the discharge device is a resistor, activation is effected by closing the electric circuit by a switch or a transistor. In the case where the energy transfer device comprises two inductive winding means, activation proceeds by passage of current through a first inductive winding means generating a magnetic field which induces current flow in a second inductive winding means. In the case where the energy transfer device is a capacitor, activation occurs through the storage of electric charge from a first cell in the capacitor and returning the electrical charge to a second cell.

The term "deactivation of the electrical energy discharge or transfer device" means interrupting the current flow through the electrical energy discharge or transfer device. In the case where the discharge device is a resistor, deactivation occurs by opening the electrical circuit with a switch or a transistor. In the case where the energy transfer device consists of a capacitor or inductive winding means, deactivation occurs by interrupting the current flow in the inductive winding means or capacitor.

According to one embodiment, the method comprises monitoring over time of a difference between the lowest voltage and the highest voltage and if this difference $\Delta V$ is greater than $\Delta Vs2$, repeating steps d) to h).

According to one embodiment, activation of said discharge device(s) is obtained by means of a switch or transistor.

According to one embodiment, the discharge device is a resistor.

According to one embodiment, the electrical energy transfer device is selected from inductive winding means and a capacitor.

According to one embodiment, at least one electrochemical cell is a lithium cell, particularly of the lithium ion or lithium polymer type.

The invention also provides a battery comprising:

a plurality of branches (Ba, Bb, ..., Bn) in parallel, each branch comprising at least two electrochemical cells in series (E1a, E2a, E3a, E1b, E2b, E3b);

an activatable electrical energy discharge or transfer device (Rb) connected across the terminals of each electrochemical cell;

a device for measuring a voltage of each electrochemical cell (V1a, V2a, V3a, V1b, V2b, V3b);

a processor configured to perform the following successive steps:

a) measuring a voltage across each electrochemical cell in a configuration where all the electrical energy discharge or transfer devices are not activated;

b) determining a lowest voltage and a highest voltage out of all the voltages measured in step a);

c) calculating a difference $\Delta V$ between the lowest voltage and the highest voltage of step b);

d) if $\Delta V$ exceeds a predetermined threshold value $\Delta Vs1$:

activating one or more electrical energy discharge or transfer device(s) connected across the terminals of the cell(s) in the branch that includes the electrochemical cell having the lowest voltage except for the electrical energy discharge or transfer device associated with the electrochemical cell having the lowest voltage, simultaneously with:

deactivating the electrical energy discharge or transfer devices connected across the terminals of the cells in the branch or branches that do not include said electrochemical cell having the lowest voltage;

e) measuring a voltage across each electrochemical cell;

f) determining a lowest voltage and a highest voltage out of all the voltages measured in step e);

g) calculating a difference $\Delta V$ between the lowest voltage and highest voltage;

h) if $\Delta V$ is less than a predetermined threshold value $\Delta Vs2$, strictly below $\Delta Vs1$, deactivating all the electrical energy discharge or transfer devices.

According to one embodiment, the processor is configured to monitor over time a difference between lowest voltage and highest voltage and if this difference $\Delta V$ is greater than $\Delta V2s$, repeating steps d) to h) of the method, with the exception that step d) no longer includes comparing $\Delta V$ with the predetermined threshold value $\Delta V1s$.

According to one embodiment, at least one electrochemical cell is a lithium cell, particularly of the lithium ion or lithium polymer type.

The invention also provides a computer program product comprising at least one sequence of instructions stored and accessible to a processor, wherein execution thereof leads to the implementation of the method steps.

The invention also relates to computer-readable information carrier, allowing at least one of the sequences of instructions of the computer program product to be executed.

BRIEF DESCRIPTION OF THE DRAWINGS

FIG. 1 shows the implementation of a balancing system according to the prior art in which a battery C has two branches in parallel Ba and Bb. Each branch comprises three serially connected electrochemical cells: E1a, E2a, E3a for branch Ba and E1b, E2b, E3b for branch Bb. Cells E2a, E3a, E1b, E2b and E3b have a higher voltage than that of cell E1a. A resistor Rb is connected across the terminals of each electrochemical cell. A switch S in the open state prevents discharge of the cell E1a through resistor Rb.

an electronic system Q comprising a measuring device U of the voltage of each electrochemical cell and a device S for activating or deactivating balancing resistors;

a microprocessor P that retrieves the voltage measurements for each electrochemical cell, and controls, via electronic system Q, activation or deactivation of the balancing resistors.

FIG. 4 shows a balancing system implemented according to the invention in which a battery C includes several branches Ba, Bb, . . . , Bn in parallel. Each branch comprises three serially connected electrochemical cells: E1a, E2a, E3a for branch Ba, and cells E1b, E2b, E3b for branch Bb. The cells E2a, E3a, E1b, E2b and E3b have a higher voltage than that of cell E1a. A resistor Rb is connected across the terminals of each electrochemical cell. A switch S in the open state prevents discharge of cells E1a, E1b, E2b and E3b through their associated resistor Rb.

1—Measurement of the voltage across each electrochemical cell;

2—Determination of the minimum and maximum voltage out of all the measured voltages;

3—Calculation of the difference between the minimum and maximum voltage $\Delta V$;

4—Comparison of $\Delta V$ with a predetermined threshold value $\Delta Vs1$;

5—Activation of the electrical energy discharge or transfer device(s) located in the branch comprising the electrochemical cell having the lowest voltage with the exception of the electrical energy discharge or transfer device associated with the electrochemical cell having the lowest voltage, and simultaneously deactivating the electrical energy discharge or transfer devices connected across the terminals of the cells in the branch or branches that do not include the electrochemical cell having the lowest voltage;

6—Measurement of the voltage across the different electrochemical cells;

7—Determination of the minimum and maximum voltage out of all the measured voltages;

8—Calculation of the difference $\Delta V$ between the minimum and maximum voltage;

9—Comparison of $\Delta V$ with a predetermined threshold value $\Delta Vs2$;

10—Deactivation of all electrical energy discharge or transfer devices.

DESCRIPTION OF PREFERRED EMBODIMENTS

Figure 3:
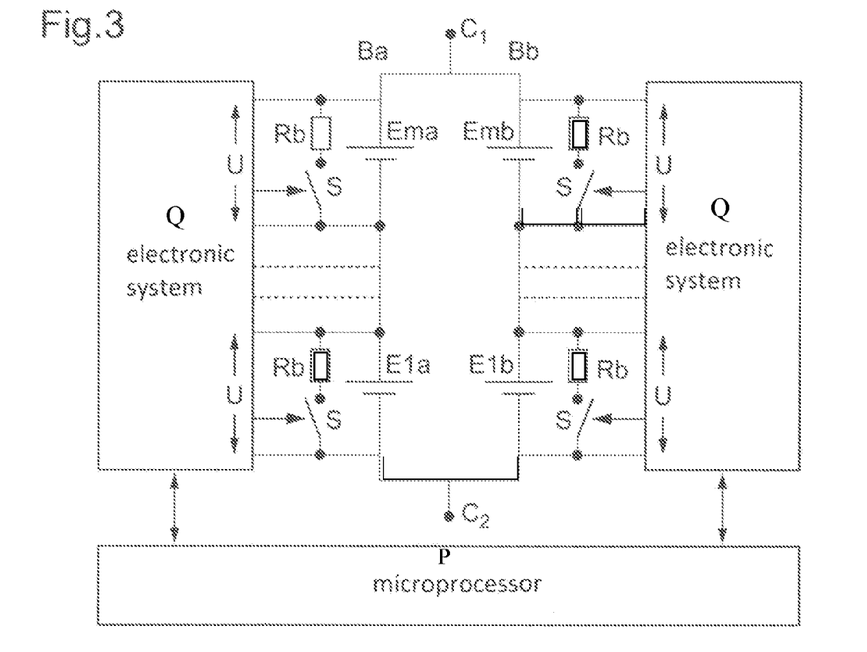
FIG. 3 shows an embodiment of the balancing system implemented according to the invention comprising.

FIG. 3 illustrates generally a battery to which the method of balancing according to the invention can be applied. A number m of electrochemical cells (E1a, . . . , Ema, E1b, . . . , Emb) are connected in series and form a part of the circuit, m being greater than or equal to 2.

In one embodiment, the nominal voltages of the electrochemical cells are identical. In a preferred embodiment, all the cells are made up of the same electrochemical pair.

The assembly formed by the m electrochemical cells connected in series form a branch Ba or Bb. The various branches are connected in parallel to a charger or to an application at connection points C1 and C2. The battery thus comprises at least two parallel branches. For the sake of simplicity, only two parallel branches are shown in FIG. 3; it is understood that the number of parallel branches is not limited to two, but can take any value beyond 2. The balancing system is capable of managing a battery with multiple branches.

Similarly, the number of cells is not limited to 2 or 3 but can take any value beyond 3.

The terminals of each electrochemical cell are connected to an electrical energy discharge or transfer device Rb. Each electrical energy discharge or transfer device can be started or stopped respectively by closing or opening of a switch S, or a transistor in series with the energy discharge or transfer device, which according to its position does or does not allow current flow through the electrical energy discharge or transfer device. When the switch is closed, the electrical energy discharge or transfer device is enabled and the electrochemical cell is discharged into the discharge device or feeds electrical energy into the transfer device. Conversely, when the switch is open, the discharge device is deactivated and the electrochemical cell is not discharged into the discharge device or does not supply energy to the electrical energy transfer device.

A first electronic system Q comprises a device for measuring the voltage U across the terminals of each electrochemical cell. A second electronic system P, such as a microprocessor calculates the difference $\Delta V$ between the voltage of the least charged cell and that of the most charged cell. When this difference exceeds a predetermined threshold $\Delta Vs1$, this means that the imbalance between voltages becomes significant and balancing is necessary. In the case of lithium electrochemical cells values for $\Delta Vs1$ generally between 10 mV and 30 mV can be chosen. The electronic circuit P determines for each electrical energy discharge or transfer device whether to activate it or not. It sends a signal to the first electronic system Q which:

i) sets to the open position firstly the switches placed in series with the discharge devices or transfer of electrical energy devices connected across the terminals of the cells of the branch which does not include the electrochemical cell with the lowest voltage and secondly the switch in series with the electrical energy discharge or transfer device connected to the electrochemical cell having the lowest voltage, and simultaneously ii) sets to the closed position the switches placed in series with the discharge devices or transfer of electrical energy devices connected across the terminals of the cells of the branch that includes the electrochemical cell having the lowest voltage, with the exception of the cell having the lowest voltage. Electronic systems P and Q may be combined into a single system.

Figure 4:
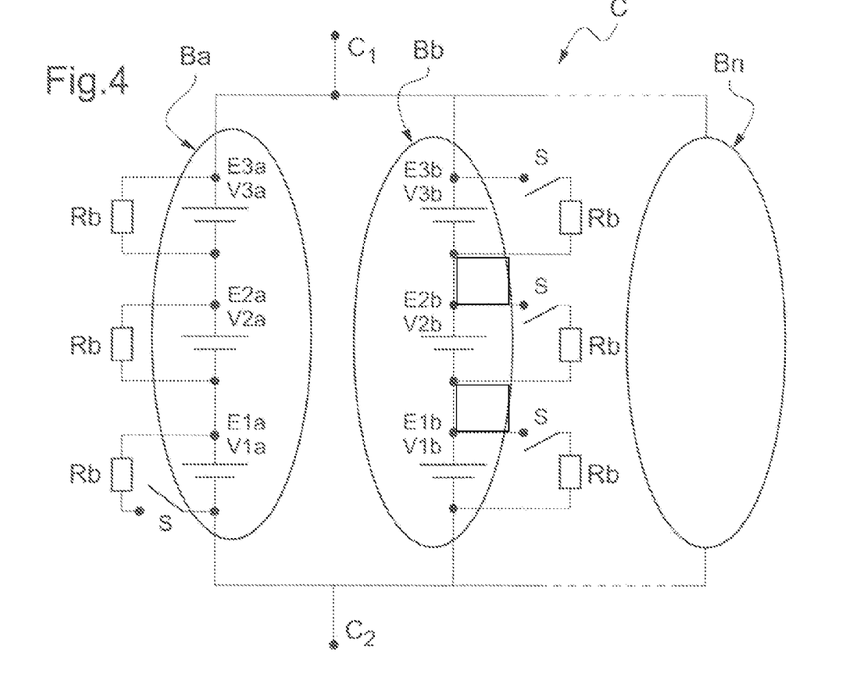

FIG. 4 shows an example of implementation of the method of balancing according to the invention. A battery C comprises several branches Ba, Bb, . . . , Bn in parallel. Each branch comprises three serially connected electrochemical cells: E1a, E2a, E3a for branch Ba and E1b, E2b, E3b for branch Bb. The terminals of all electrochemical cells are connected to a discharge device or energy transfer device Rb. Each electrical energy discharge or transfer device can be activated or deactivated by closing or opening of a switch S in series with the latter. In the example of FIG. 4, the cells E2a, E3a, E1b, E2b and E3b have a higher voltage than that of the cell E1a. The open or closed position of each switch is controlled by the electronic system Q, not shown.

Figure 5:
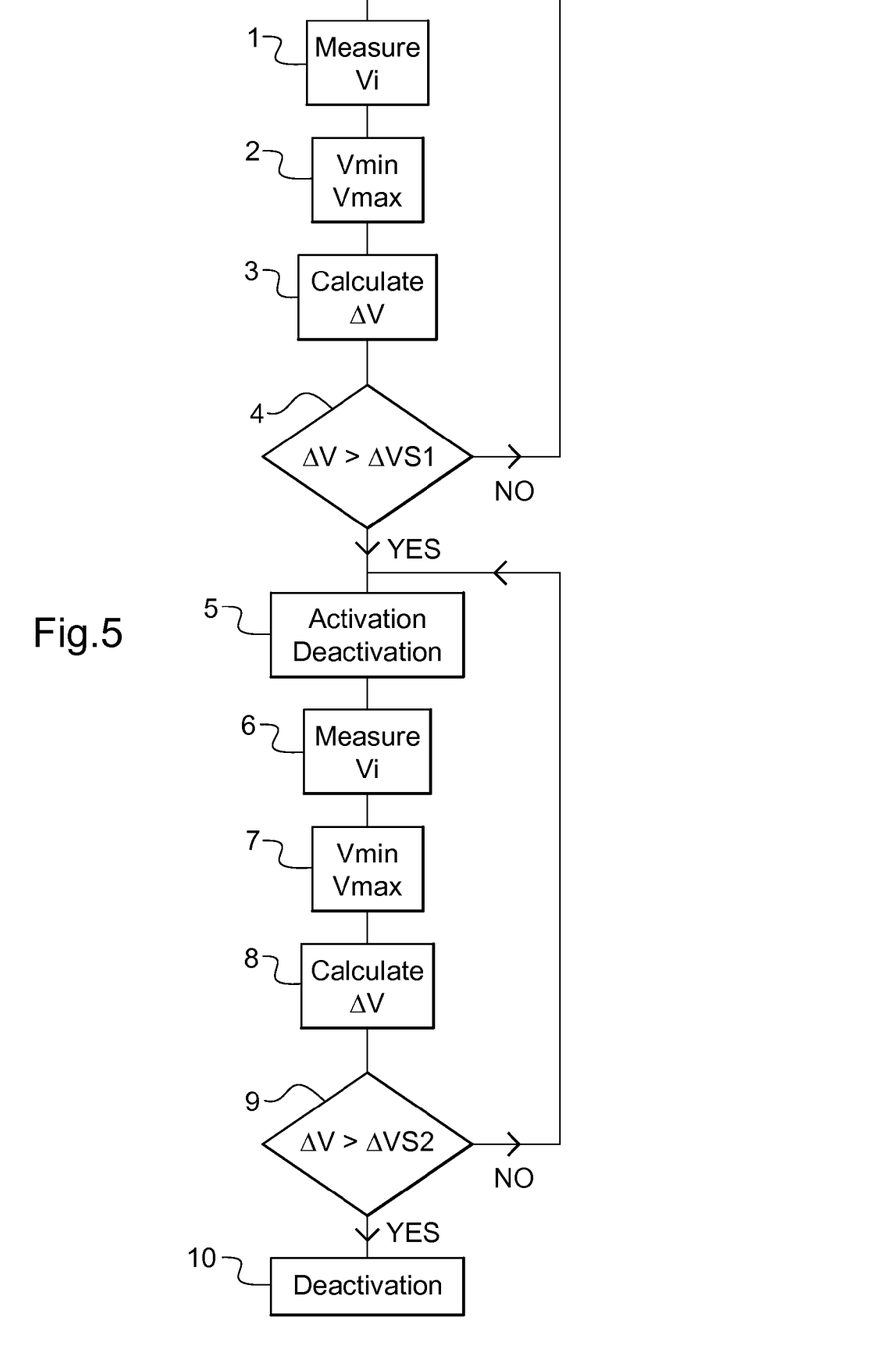
FIG. 5 is a block diagram showing the different stages of the method according to the invention wherein the steps are.

The balancing procedure operates on the principle shown in FIG. 5.

In step 1, the terminal voltage of each electrochemical cell is measured using the measuring device of electronic system Q. The voltage values of each electrochemical cell are stored in a memory of electronic system P.

In step 2, the electronic system P determines minimum and maximum voltage of each electrochemical cell.

In step 3, electronic system P calculates the difference $\Delta V$ between the minimum and maximum voltage.

In step 4, the electronic system P compares $\Delta V$ with a predetermined threshold value $\Delta Vs1$. $\Delta Vs1$ is predetermined by the user and sets the limit value of the allowable voltage spread. When $\Delta V$ is less than $\Delta Vs1$, it is considered that the extent of voltage spread is acceptable and does not necessitate balancing. When $\Delta V$ exceeds $\Delta Vs1$, it is considered that the extent of the voltage spread has exceeded the allowable limit and balancing is performed.

In step 5, the balancing begins with activation by the electronic system Q of the discharge or energy transfer devices located in the branch that includes the electrochemical cell having the lowest voltage except for the electrical energy discharge or transfer device associated with the electrochemical cell with the lowest voltage that remains deactivated simultaneously with deactivation of the discharge or energy transfer devices located in the branch that does not include the cell having the lowest voltage;

In step 6, using the measuring device of electronic system Q the voltage across the various electrochemical cells is measured;

In step 7, electronic system P measures the difference between the minimum and maximum voltage $\Delta V2$;

In step 8, the electronic system P compares $\Delta V$ with a predetermined threshold value $\Delta Vs2$. $\Delta Vs2$ is predetermined by the user and defines the limit below which it is considered that the cells are balanced. When $\Delta V$ is higher than $\Delta Vs2$, it is considered that the voltage spread is too large and balancing is continued, by going back to step 5. When $\Delta V$ is less than $\Delta Vs2$, it is considered that the voltage spread is low enough to stop balancing and in step 9 all discharge devices are deactivated. Deactivation by electronic system Q of all discharge devices terminates balancing. Typically, one can choose a value for $\Delta Vs2$ that is close to the degree of uncertainty in the voltage measuring device, for example between 5 mV and 20 mV.

Measurement of the voltages across each electrochemical cell is performed periodically. The periodicity of measurement depends on the value of the discharging resistor or the impedance of the energy transfer device. The lower the resistance of the discharge device, the more rapid is the discharge and the more the time interval between two measurements is reduced. Typically, a periodicity of one second or one minute can be used.

Figure 6:
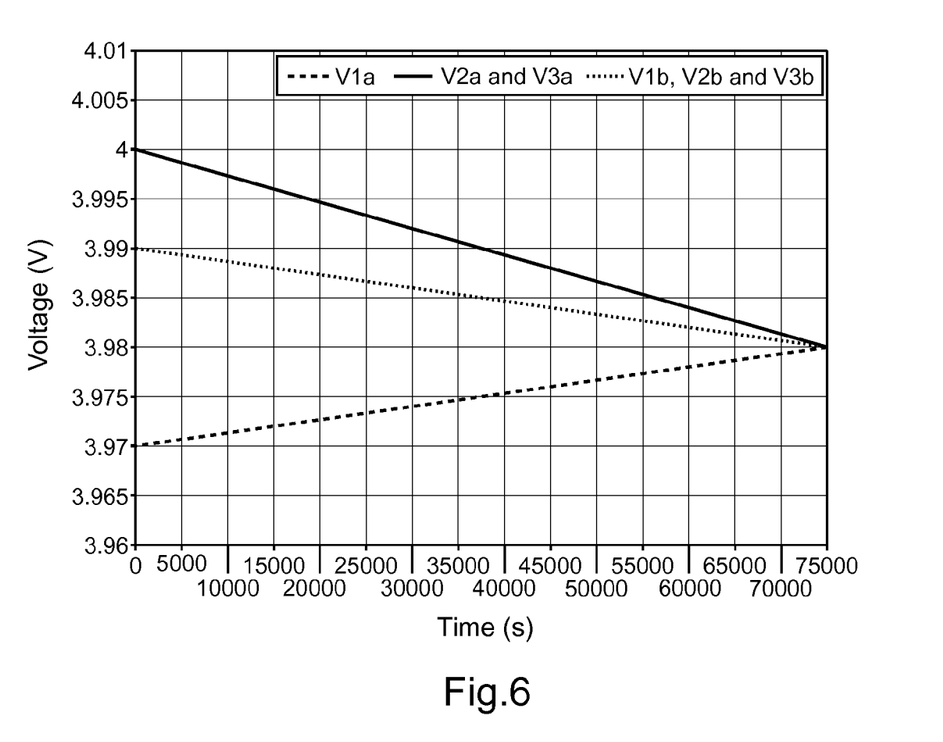
FIG. 6 shows variation with time of the electrochemical cell voltage balancing system according to the invention shown in FIG. 4. The electrochemical cells are of the lithium-ion type with a capacity of 45 Ah and the resistors are 43 ohms.

The variation in voltages with time during the balancing phase of the device of FIG. 4 is shown in FIG. 6. Balancing was triggered because the difference in voltage between the lowest and the highest voltage $\Delta V$ reached the limit value for $\Delta Vs1$ equal to 30 mV. During the balancing phase, the cell voltage of these cells in electrochemical branch Bb drops by 10 mV, cell voltage in branch Ba that are the most highly charged drops by 20 mV and the cell voltage of the cell in branch Ba with the lowest voltage increases by 10 mV. Balancing stops when the voltage difference between the lowest and the highest voltage $\Delta V$ reaches 0 mV.

We can consequently see that the least charged cell has undergone recharging. In general, the greater the number of cells in a particular branch, the larger the increase in voltage of the electrochemical cell with the lowest voltage will be.

One advantage of the method is that it allows for balancing on a branch-by-branch basis.

The advantage of the method according to the invention is that it allows charging of the electrochemical cell to be rebalanced. The energy released by the most highly charged cells is not completely lost as heat. Part of the energy contained in the most highly charged electrochemical cells is used to recharge the cell which is the least charged. The system according to the invention is more useful from the point of view of energy efficiency. The system can be described as "semi-active" because on the one hand it recharges the most poorly charged cell and on the other hand discharges the most highly charged cells so that the voltages of all cells of the battery converge to the same value.

The invention also provides a computer program product comprising at least one stored sequence of instructions accessible to a processor, wherein execution thereof leads to the implementation of the steps of the method according to the invention.

The invention also provides a computer-readable information carrier, allowing execution of at least one of the sequences of instructions of the computer program product. The computer program may be stored on a data carrier readable by a computer, such as any type of disk, floppy disk, optical disk, CD-ROM, magneto-optical disk, ROM memory, RAM memory, electrically programmable read-only memory (EPROM), and electrically programmable and erasable ROM memory (EEPROM), magnetic or optical card or any type of media suitable for storing electronic instructions, and capable of being coupled to a system bus of a computer.

What is claimed is:

1. A method for balancing a battery comprising a plurality of branches in parallel, each branch comprising at least two electrochemical cells in series, an activatable electrical energy discharge or transfer device connected across the terminals of each electrochemical cell, said method comprising the following successive steps:
   a) measuring a voltage across each electrochemical cell in a configuration where all the electrical energy discharge or transfer devices are not activated;
   b) determining a lowest voltage and a highest voltage out of all the voltages measured in step a);
   c) calculating a difference $\Delta V$ between the lowest voltage and the highest voltage from step b);
   d) if $\Delta V$ exceeds a predetermined threshold value $\Delta Vs1$:
      activating the electrical energy discharge or transfer device(s) connected across the terminals of the cell(s) of that branch which includes the electrochemical cell having the lowest voltage with the exception of the electrical energy discharge or transfer device associated with the electrochemical cell having the lowest voltage, simultaneously with:
      deactivating the electrical energy discharge or transfer devices connected across the terminals of the cells of the branch or branches that do not include the electrochemical cell with the lowest voltage;
   e) measuring the voltage across each electrochemical cell;
   f) determining a lowest voltage and a highest voltage out of all the voltages measured in step e);
   g) calculating a difference $\Delta V$ between the lowest voltage and the highest voltage;
   h) if $\Delta V$ is less than a predetermined threshold value $\Delta Vs2$, strictly below $\Delta Vs1$, deactivating all electrical energy discharge or transfer devices.

2. The balancing method according to claim 1, including monitoring over time a difference between lowest voltage and highest voltage and if this difference $\Delta V$ is greater than $\Delta Vs2$, repeating steps d) to h).

3. The balancing method according to claim 1, wherein the discharge device is a resistor.

4. The balancing method according to claim 1, wherein activation of said discharge device(s) is obtained by means of a switch or transistor.

5. The balancing method according to claim 1, wherein the electrical energy transfer device is selected from inductive winding means and a capacitor.

6. The balancing method as claimed in claim 1, wherein at least one electrochemical cell is a lithium cell, particularly of the lithium ion or lithium polymer type.

7. A battery comprising:
   a plurality of branches in parallel, each branch comprising at least two electrochemical cells in series;
   an activatable electrical energy discharge or transfer device connected across the terminals of each electrochemical cell;
   a device for measuring a voltage of each electrochemical cell;
   a processor configured to perform the following successive steps:
   a) measuring a voltage across each electrochemical cell in a configuration where all the electrical energy discharge or transfer devices are not activated;
   b) determining a lowest voltage and a highest voltage out of all the voltages measured in step a);
   c) calculating a difference $\Delta V$ between the lowest voltage and the highest voltage of step b);
   d) if $\Delta V$ exceeds a predetermined threshold value $\Delta Vs1$:
      activating one or more electrical energy discharge or transfer device(s) connected across the terminals of the cell(s) in the branch that includes the electrochemical cell having the lowest voltage except for the electrical energy discharge or transfer device associated with the electrochemical cell having the lowest voltage, simultaneously with:
      deactivating the electrical energy discharge or transfer devices connected across the terminals of the cells in the branch or branches that do not include said electrochemical cell having the lowest voltage;
   e) measuring a voltage across each electrochemical cell;
   f) determining a lowest voltage and a highest voltage out of all the voltages measured in step e);
   g) calculating a difference $\Delta V$ between the lowest voltage and highest voltage;
   h) if $\Delta V$ is less than a predetermined threshold value $\Delta Vs2$, strictly below $\Delta Vs1$, deactivating all the electrical energy discharge or transfer devices.

8. The battery of claim 7, wherein the processor is configured to monitor over time a difference between lowest voltage and highest voltage and if this difference $\Delta V$ is greater than $\Delta V2s$, repeating the following steps d) to h):
   d) if $\Delta V$ exceeds a predetermined threshold value $\Delta Vs1$:
      activating the electrical energy discharge or transfer device(s) connected across the terminals of the cell(s) of that branch which includes the electrochemical cell having the lowest voltage with the exception of the electrical energy discharge or transfer device associated with the electrochemical cell having the lowest voltage, simultaneously with:
      deactivating the electrical energy discharge or transfer devices connected across the terminals of the cells of the branch or branches that do not include the electrochemical cell with the lowest voltage;
   e) measuring a voltage across each electrochemical cell;
   f) determining a lowest voltage and a highest voltage out of all the voltages measured in step e);
   g) calculating a difference $\Delta V$ between the lowest voltage and the highest voltage;
   h) if $\Delta V$ is less than a predetermined threshold value $\Delta Vs2$, strictly below $\Delta Vs1$, deactivating all electrical energy discharge or transfer devices,
   with the exception that step d) no longer includes comparing $\Delta V$ with the predetermined threshold value $\Delta V1s$.

9. The battery of claim 7 wherein the discharge device is a resistor.

10. The battery according to claim 7, wherein activation of said electrical energy discharge device(s) is obtained by means of a switch or transistor.

11. The battery according to claim 7, wherein the electrical energy transfer device is selected from inductive winding means and a capacitor.

12. The battery according to claim 7, wherein at least one electrochemical cell is a lithium cell, particularly of the lithium ion or lithium polymer type.

13. A non-transitory computer program product comprising at least one sequence of instructions stored and accessible to a processor, wherein execution thereof leads to the implementation of a method for balancing a battery comprising a plurality of branches in parallel, each branch comprising at least two electrochemical cells in series, an activatable electrical energy discharge or transfer device connected across the terminals of each electrochemical cell, said method comprising the following successive steps:
   a) measuring a voltage across each electrochemical cell in a configuration where all the electrical energy discharge or transfer devices are not activated;
   b) determining a lowest voltage and a highest voltage out of all the voltages measured in step a);
   c) calculating a difference $\Delta V$ between the lowest voltage and the highest voltage from step b);
   d) if $\Delta V$ exceeds a predetermined threshold value $\Delta Vs1$:
      activating the electrical energy discharge or transfer device(s) connected across the terminals of the cell(s) of that branch which includes the electrochemical cell having the lowest voltage with the exception of the electrical energy discharge or transfer device associated with the electrochemical cell having the lowest voltage, simultaneously with:
      deactivating the electrical energy discharge or transfer devices connected across the terminals of the cells of the branch or branches that do not include the electrochemical cell with the lowest voltage;
   e) measuring a voltage across each electrochemical cell;
   f) determining a lowest voltage and a highest voltage out of all the voltages measured in step e);
   g) calculating a difference $\Delta V$ between the lowest voltage and the highest voltage;
   h) if $\Delta V$ is less than a predetermined threshold value $\Delta Vs2$, strictly below $\Delta Vs1$, deactivating all electrical energy discharge or transfer devices.

14. A non-transitory computer-readable information carrier, allowing at least one of the sequences of instructions of a computer program product comprising at least one sequence of instructions stored and accessible to a processor to be carried out, wherein execution thereof leads to the implementation of a method for balancing a battery comprising a plurality of branches in parallel, each branch comprising at least two electrochemical cells in series, an activatable electrical energy discharge or transfer device connected across the terminals of each electrochemical cell, said method comprising the following successive steps:
   a) measuring a voltage across each electrochemical cell in a configuration where all the electrical energy discharge or transfer devices are not activated;
   b) determining a lowest voltage and a highest voltage out of all the voltages measured in step a);
   c) calculating a difference $\Delta V$ between the lowest voltage and the highest voltage from step b);
   d) if $\Delta V$ exceeds a predetermined threshold value $\Delta Vs1$:
      activating the electrical energy discharge or transfer device(s) connected across the terminals of the cell(s) of that branch which includes the electrochemical cell having the lowest voltage with the exception of the electrical energy discharge or transfer device associated with the electrochemical cell having the lowest voltage, simultaneously with:
      deactivating the electrical energy discharge or transfer devices connected across the terminals of the cells of the branch or branches that do not include the electrochemical cell with the lowest voltage;
   e) measuring a voltage across each electrochemical cell;
   f) determining a lowest voltage and a highest voltage out of all the voltages measured in step e);
   g) calculating a difference $\Delta V$ between the lowest voltage and the highest voltage;
   h) if $\Delta V$ is less than a predetermined threshold value $\Delta Vs2$, strictly below $\Delta Vs1$, deactivating all electrical energy discharge or transfer devices.

* * * * *